United States Patent
Ma et al.

(10) Patent No.: US 10,783,290 B2
(45) Date of Patent: Sep. 22, 2020

(54) IC MANUFACTURING RECIPE SIMILARITY EVALUATION METHODS AND SYSTEMS

(71) Applicant: TAIWAN SEMICONDUCTOR MANUFACTURING COMPANY, LTD., Hsinchu (TW)

(72) Inventors: Kang-Heng Ma, Hsinchu (TW); Ching-Hsi Nan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 91 days.

(21) Appl. No.: 15/882,138

(22) Filed: Jan. 29, 2018

(65) Prior Publication Data
US 2019/0095565 A1 Mar. 28, 2019

Related U.S. Application Data

(60) Provisional application No. 62/564,411, filed on Sep. 28, 2017.

(51) Int. Cl.
*G06F 30/30* (2020.01)
*G05B 19/4063* (2006.01)
(Continued)

(52) U.S. Cl.
CPC ......... *G06F 30/30* (2020.01); *G05B 19/4063* (2013.01); *G05B 19/41875* (2013.01);
(Continued)

(58) Field of Classification Search
CPC ...... G06F 16/283; G06F 17/248; G06F 19/00; G06F 3/0481; G06F 3/0482;
(Continued)

(56) References Cited

U.S. PATENT DOCUMENTS 5,591,299 A * 1/1997 Seaton ............. G05B 19/41865
700/121
6,035,293 A * 3/2000 Lantz ..................... G06Q 10/06
(Continued)

FOREIGN PATENT DOCUMENTS

JP 2007059778 A * 3/2007
TW 200823616 6/2008

OTHER PUBLICATIONS

Office Action dated Jan. 18, 2019 from corresponding application No. TW 107113751.

*Primary Examiner* — Helen Rossoshek
(74) *Attorney, Agent, or Firm* — Hautpman Ham, LLP

(57) ABSTRACT

A method includes, for a first tool-log variable of a set of tool-log variables, comparing a first tool-log variable result from a first integrated circuit (IC) manufacturing recipe to a first tool-log variable result from a second IC manufacturing recipe. The set of tool-log variables corresponds to one or more tool-logs generated from execution of the first IC manufacturing recipe and the second IC manufacturing recipe on an IC manufacturing tool. Based on the comparison, a first tool-log variable similarity value for the first tool-log variable is assigned, and, based on the first tool-log variable similarity value, a recipe similarity value for the first IC manufacturing recipe and the second IC manufacturing recipe is calculated. At least one of comparing the first tool-log variable results, assigning the first tool-log variable similarity value, or calculating the recipe similarity value is performed by a processing device.

17 Claims, 5 Drawing Sheets

(51) Int. Cl.
*G05B 19/418* (2006.01)
*G05B 23/02* (2006.01)
*G06F 3/0481* (2013.01)
*G06F 11/00* (2006.01)

(52) U.S. Cl.
CPC .............. *G05B 23/0235* (2013.01); *G05B 2219/45031* (2013.01); *G06F 3/0481* (2013.01); *G06F 11/008* (2013.01)

(58) Field of Classification Search
CPC .. G06F 3/0484; G06F 11/008; G06F 17/5045; G06F 30/30; H01L 21/32139; H01L 21/67155; Y02P 90/30; G05B 19/41875; G05B 19/4063; G05B 2219/45031; G05B 23/0235; G06Q 50/04; G06Q 10/06395; G06Q 10/0639
See application file for complete search history.

(56) References Cited

U.S. PATENT DOCUMENTS

| | | | | |
|---|---|---|---|---|
| 6,077,386 A * | 6/2000 | Smith, Jr. | | G01J 3/28 118/713 |
| 6,419,801 B1 * | 7/2002 | Smith, Jr. | | G01J 3/28 204/192.13 |
| 6,665,575 B2 * | 12/2003 | Betawar | | G05B 19/41865 700/121 |
| 6,671,570 B2 * | 12/2003 | Schulze | | H01L 22/20 700/121 |
| 6,735,493 B1 * | 5/2004 | Chou | | G05B 19/41865 700/110 |
| 6,909,996 B2 * | 6/2005 | Huang | | G05B 19/41865 702/179 |
| 6,980,873 B2 | 12/2005 | Shen | | |
| 6,990,388 B2 * | 1/2006 | Akimori | | G06Q 10/06 700/121 |
| 7,031,860 B2 * | 4/2006 | Liang | | G05B 19/41875 702/84 |
| 7,039,556 B2 * | 5/2006 | Whitefield | | G05B 19/41875 702/183 |
| 7,070,477 B2 * | 7/2006 | Morisawa | | B24B 37/042 451/41 |
| 7,092,778 B2 * | 8/2006 | Huang | | G05B 19/418 700/105 |
| 7,117,057 B1 * | 10/2006 | Kuo | | G05B 19/41875 700/108 |
| 7,225,039 B2 * | 5/2007 | Chung | | G05B 19/41865 700/103 |
| 7,257,454 B2 * | 8/2007 | Chien | | G06Q 10/06 700/101 |
| 7,260,443 B2 * | 8/2007 | Morinaga | | G05B 19/41865 700/121 |
| 7,286,891 B2 | 10/2007 | Chung et al. | | |
| 7,302,305 B2 * | 11/2007 | You | | G05B 19/41865 700/101 |
| 7,313,450 B1 * | 12/2007 | Fu | | G05B 19/41875 700/31 |
| 7,346,883 B2 * | 3/2008 | Keck | | G06Q 10/06 700/121 |
| 7,353,475 B2 * | 4/2008 | White | | G06F 17/5068 257/E21.244 |
| 7,369,913 B2 * | 5/2008 | Heminway | | G05B 19/41865 700/100 |
| 7,493,236 B1 * | 2/2009 | Mock | | G05B 23/0227 700/26 |
| 7,632,690 B2 * | 12/2009 | Gibson, Jr. | | H01J 37/32935 438/9 |
| 7,716,009 B2 * | 5/2010 | Ahmed | | G05B 19/41865 438/14 |
| 7,848,835 B2 * | 12/2010 | Conway | | C30B 1/02 700/120 |
| 7,848,840 B2 * | 12/2010 | Dao | | G05B 11/42 219/121.58 |
| 7,974,728 B2 | 7/2011 | Lin et al. | | |
| 8,010,321 B2 * | 8/2011 | Lin | | G05B 19/0428 702/179 |
| 8,335,582 B2 * | 12/2012 | Shimshi | | G05B 19/0428 700/108 |
| 8,504,186 B2 * | 8/2013 | Schmidt | | G05B 17/02 700/108 |
| 8,560,977 B2 * | 10/2013 | Matsuoka | | G03F 7/0002 716/30 |
| 8,639,365 B2 * | 1/2014 | Pannese | | G03F 7/70525 700/28 |
| 8,682,466 B2 | 3/2014 | Ko et al. | | |
| 8,774,956 B2 * | 7/2014 | Moyne | | G05B 19/41865 700/109 |
| 8,825,189 B2 * | 9/2014 | Moore, Jr. | | G05B 19/41865 700/95 |
| 8,849,615 B2 * | 9/2014 | Kost | | G05B 23/024 702/185 |
| 9,002,498 B2 | 4/2015 | Chang | | |
| 9,280,151 B2 * | 3/2016 | Chang | | G05B 19/41865 |
| 9,349,660 B2 | 5/2016 | Tsai et al. | | |
| 9,424,528 B2 * | 8/2016 | Kaushal | | G05B 13/0265 |
| 2003/0139936 A1 * | 7/2003 | Saucier | | G06Q 10/06 705/301 |
| 2005/0228765 A1 * | 10/2005 | Huang | | G06F 16/93 |
| 2005/0285056 A1 | 12/2005 | Smith et al. | | |
| 2007/0129839 A1 * | 6/2007 | Tsubakida | | G05B 19/41865 700/121 |
| 2007/0233302 A1 * | 10/2007 | Miyazaki | | G05B 19/41865 700/108 |
| 2008/0071405 A1 * | 3/2008 | Liu | | G03F 7/26 700/108 |
| 2008/0147228 A1 * | 6/2008 | Fenner | | G05B 19/41835 700/121 |
| 2008/0249648 A1 * | 10/2008 | Araki | | H01L 21/6715 700/112 |
| 2009/0105864 A1 | 4/2009 | Lloyd et al. | | |
| 2010/0249976 A1 | 9/2010 | Aharoni et al. | | |
| 2012/0262689 A1 * | 10/2012 | Van Ingen Schenau | | G03F 7/70116 355/67 |
| 2013/0006406 A1 | 1/2013 | Aharoni et al. | | |
| 2014/0320627 A1 * | 10/2014 | Miyamoto | | G03F 7/70633 348/80 |
| 2015/0161515 A1 | 6/2015 | Matsuoka | | |
| 2015/0279173 A1 * | 10/2015 | Hyde | | G06Q 10/10 340/815.4 |
| 2016/0018829 A1 * | 1/2016 | Ellec | | G05D 7/0635 700/282 |
| 2016/0041548 A1 * | 2/2016 | Chung | | G05B 23/0221 700/108 |
| 2016/0264922 A1 * | 9/2016 | Ozaki | | C12M 37/02 |
| 2016/0321594 A1 * | 11/2016 | Linde | | G06Q 10/06395 |
| 2016/0329224 A1 * | 11/2016 | Yamamoto | | H01L 21/67276 |
| 2017/0220008 A1 | 8/2017 | Takahashi et al. | | |
| 2019/0103293 A1 * | 4/2019 | Kim | | H01L 21/67069 |

* cited by examiner

IC MANUFACTURING RECIPE SIMILARITY EVALUATION METHODS AND SYSTEMS

BACKGROUND

Manufacturing of integrated circuits (IC) includes the execution of numerous operations using a variety of IC manufacturing tools. Tool operation is commonly controlled using IC manufacturing recipes in which tool instructions and operating settings are documented. Prior to being used in production, IC recipes are often created as part of research and development activities through which manufacturing efficiency, quality, yield, and reliability are improved.

Typically, an IC manufacturing tool executing a recipe generates entries in a tool-log to capture operational results for use as feedback for quality control and process development. The various IC manufacturing tools include functionality for forming and testing IC structures and for measuring parameters related to tool operations and structure features, so tool-log entries often include tool set-point data combined with measurement data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
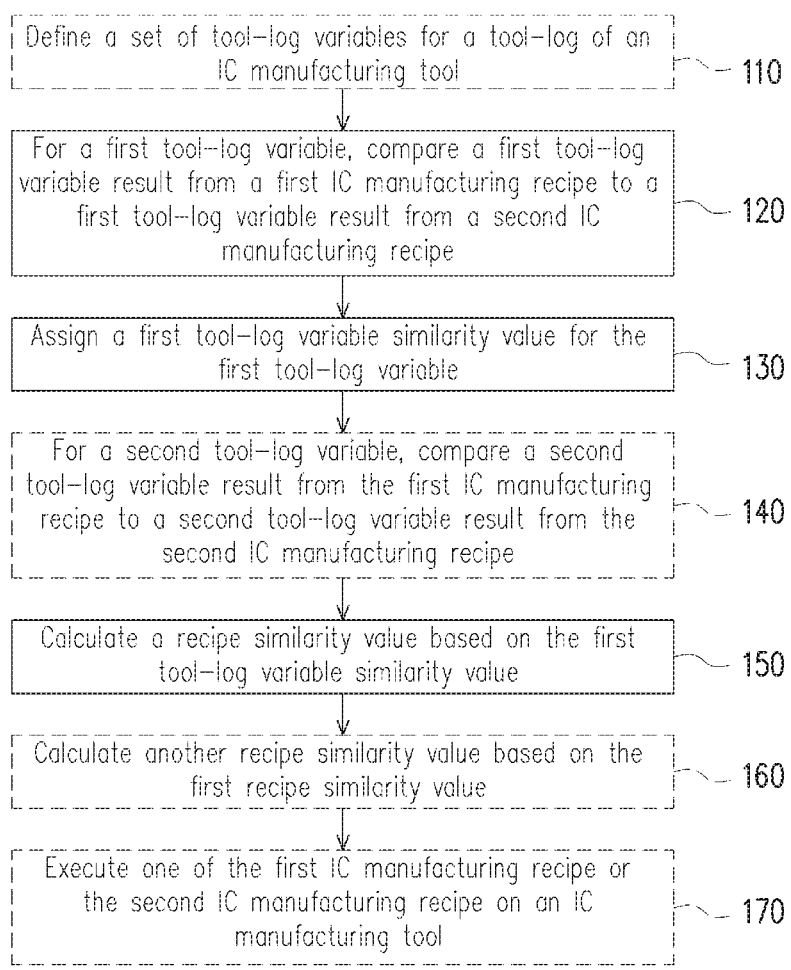
FIG. 1 is a flowchart of a method of evaluating IC manufacturing recipe similarity, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, methods and systems are directed to evaluating similarity between IC manufacturing recipes by comparing a first tool-log result based on a first IC manufacturing recipe executed on an IC manufacturing tool to a first tool-log result based on a second IC manufacturing recipe executed on the IC manufacturing tool, assigning a similarity value based on the comparison, and calculating a recipe similarity value based on the similarity value. The various embodiments enable IC manufacturing recipe similarity to be evaluated with improved efficiency, without accessing IC manufacturing recipes or relying on recipe naming conventions, allow flexible criteria to be applied to similarity calculations, and used to monitor IC manufacturing tool performance, thereby improving IC manufacturing processes used in IC structure formation.

FIG. 1 is a flowchart of a method 100 of evaluating IC manufacturing recipe similarity, in accordance with one or more embodiments. In some embodiments, some or all of method 100 is implemented using an IC manufacturing recipe similarity evaluation system such as an IC manufacturing recipe similarity evaluation system 410 in an IC manufacturing environment 400, discussed below with respect to FIG. 4.

The sequence in which the operations of method 100 are depicted in FIG. 1 is for illustration only; the operations of method 100 are capable of being executed in sequences that differ from that depicted in FIG. 1. In some embodiments, operations in addition to those depicted in FIG. 1 are performed before, between, and/or after the operations depicted in FIG. 1. In some embodiments, the operations of method 100 are a subset of operations of one or more methods of manufacturing one or more IC structures.

At optional operation 110, a set of tool-log variables is defined for a tool-log of an IC manufacturing tool. The tool-log includes data resulting from the execution of one or more IC manufacturing recipes on one or more IC manufacturing tools as part of fabricating one or more IC structures.

In some embodiments, the one or more IC manufacturing tools include equipment that perform fabrication processes, non-limiting examples of which include vapor deposition, etching, photolithography, polishing, film production, epitaxial growth, annealing, cleaning or the like. In some embodiments, the one or more IC manufacturing tools include equipment that perform test functions, non-limiting examples of which include electrical, optical, thermal, mechanical tests or the like. In some embodiments, the one or more IC manufacturing tools include material handling equipment for transporting, positioning, or controlling environments for substrates containing the one or more IC structures.

In various embodiments, the one or more IC manufacturing tools include a standalone tool, a tool cluster, or a combination of one or more standalone tools and one or more tool clusters.

The one or more IC manufacturing recipes include instructions and/or settings corresponding to one or more of, e.g., equipment settings for one or more fabrication processes, test condition settings for one or more test functions, or material handling instructions for material handling equipment.

The tool-log includes result data corresponding to one or more of, e.g., equipment settings for one or more fabrication processes, equipment readings from one or more fabrication processes, IC structure readings from one or more fabrication processes, test condition settings for one or more test functions, test condition readings from one or more tests, IC structure readings from one or more tests, or material handling instructions for material handling equipment.

Non-limiting examples of equipment settings include programmed temperatures, pressures, forces, flow rates, concentration levels, energy levels, durations or the like. Non-limiting examples of equipment readings include measured or sensed temperatures, pressures, forces, flow rates, concentration levels, energy levels, durations or the like. Non-limiting examples of IC structure readings from one or more fabrication processes include measured or sensed temperatures, physical dimensions, resistance, capacitance, or other electrical, optical, physical, or thermal properties or the like.

Non-limiting examples of test condition settings include programmed electrical, optical, mechanical stresses or the like. Non-limiting examples of test condition readings include measured or sensed electrical, optical, mechanical stresses or the like. Non-limiting examples of IC structure readings from one or more tests include measured or sensed temperatures, physical dimensions, resistance, capacitance, or other electrical, optical, physical, thermal properties or the like.

Non-limiting examples of material handling instructions include instructions for moving, loading, unloading, aligning, positioning, or rotating IC substrates, opening or closing chamber doors or valves, or initiating or terminating power up, power down, calibration, or other manufacturing support operations.

In some embodiments, the one or more IC manufacturing recipes include instructions and/or settings corresponding to a single IC manufacturing tool. In some embodiments, the one or more IC manufacturing recipes include instructions and/or settings corresponding to more than one IC manufacturing tool.

In various embodiments, the one or more IC manufacturing recipes include a file, a collection of files, or one or more databases. In various embodiments, the one or more IC manufacturing recipes are located at a single location or are distributed among multiple locations. In various embodiments, some or all of the one or more IC manufacturing recipes is stored in one or more non-transitive, computer readable storage media, e.g., an IC manufacturing recipe storage device 430, discussed below with respect to IC manufacturing environment 400 and FIG. 4.

In some embodiments, the tool-log includes result data from a single IC manufacturing tool. In some embodiments, the tool-log includes result data from more than one IC manufacturing tool. In some embodiments, the tool-log includes result data from one or more IC manufacturing tools 450, discussed below with respect to IC manufacturing environment 400 and FIG. 4.

In some embodiments, the tool-log includes result data from a single execution of a single IC recipe on one or more IC manufacturing tools. In some embodiments, the tool-log includes result data from multiple executions of a single IC recipe on one or more IC manufacturing tools. In some embodiments, the tool-log includes result data from single executions of each of multiple IC manufacturing recipes on one or more IC manufacturing tools. In some embodiments, the tool-log includes result data from multiple executions of multiple IC recipes on one or more IC manufacturing tools.

In various embodiments, the tool-log includes a file, a collection of files, or one or more databases. In various embodiments, the tool-log is located at a single location or is distributed among multiple locations. In various embodiments, some or all of the tool-log is stored in one or more non-transitive, computer readable storage media, e.g., a tool-log storage device 440, discussed below with respect to IC manufacturing environment 400 and FIG. 4.

Defining the set of tool-log variables includes defining each tool-log variable of the set of tool-log variables corresponding to one or more tool-log results from an IC manufacturing recipe executed on the IC manufacturing tool. In some embodiments, defining the set of tool-log variables includes defining the set of tool-log variables corresponding to an entirety of the data results in a tool-log. In some embodiments, defining the set of tool-log variables includes defining the set of tool-log variables corresponding to a subset of the data results in a tool-log. In some embodiments, defining the set of tool-log variables includes defining the set of tool-log variables corresponding to a single data result in a tool-log.

In some embodiments, defining the set of tool-log variables includes defining a tool-log variable of the set of tool-log variables corresponding to an individual tool-log result, e.g., an equipment setting for a fabrication process, an equipment reading for a fabrication process, a test condition setting for a test function, a test condition reading for a test function, an IC structure reading from a fabrication process or test function, or a material handling instruction. In some embodiments, defining the set of tool-log variables includes defining a tool-log variable of the set of tool-log variables corresponding to a relationship between individual tool-log results, e.g., a difference between an equipment setting for a given fabrication process and an equipment reading for the given fabrication process, or a value determined from a test condition setting for a given test function combined mathematically with an IC structure reading based on the test condition.

In some embodiments, defining the set of tool-log variables includes defining a tool-log variable of the set of tool-log variables corresponding to a collection of tool-log results, e.g., a number of steps of an IC manufacturing recipe executed on one or more IC manufacturing tools or a duration of one or more IC manufacturing steps.

In some embodiments, defining the set of tool-log variables includes defining one or more sets of tool-log variables using a processing device, e.g., sets of tool-log variables 520 and processor 502, discussed below with respect to IC manufacturing recipe similarity evaluation system 500 and FIG. 5.

In some embodiments, operation 110 is not performed, and the set of tool-log variables corresponding to the tool-log as discussed above is a predetermined set of tool-log variables.

At operation 120, for a first tool-log variable of the set of tool-log variables, a first tool-log variable result from a first IC manufacturing recipe is compared to a first tool-log variable result from a second IC manufacturing recipe. In some embodiments, comparing the first tool-log variable results includes comparing the first tool-log variable results from different tool logs. In some embodiments, comparing the first tool-log variable results includes comparing the first tool-log variable results from a same tool log, in which case the first tool-log variable results reflect IC manufacturing tool performance over time or with respect to operations related to multiple substrates.

In some embodiments, comparing the first tool-log variable results includes the first IC manufacturing recipe being different from the second IC manufacturing recipe. In some embodiments, comparing the first tool-log variable results includes the first IC manufacturing recipe and the second IC manufacturing recipe being a same IC manufacturing recipe.

In some embodiments, comparing the first tool-log variable results includes the first IC manufacturing recipe and the second IC manufacturing recipe being a same IC manufacturing recipe, the first tool-log variable result corresponding to execution of a first portion of the same IC manufacturing recipe, and the second tool-log variable result corresponding to execution of a second portion of the same IC manufacturing recipe. In some embodiments, comparing the first tool-log variable results includes the first IC manufacturing recipe and the second IC manufacturing recipe being a same IC manufacturing recipe, the first tool-log variable results corresponding to first and second executions of the same IC manufacturing recipe.

In some embodiments, comparing the first tool-log variable results includes performing an arithmetic function, e.g., addition, subtraction, multiplication or division, between two or more tool-log variable results. In some embodiments, comparing the first tool-log variable results includes comparing each of the first tool-log variable results to a predetermined value, e.g., a nominal value or a threshold value. In some embodiments, comparing the first tool-log variable results includes comparing each of the first tool-log variable results to a value, e.g., a nominal value or a threshold value, determined from one or more additional tool-log results.

In some embodiments, comparing the first tool-log variable results includes performing a statistical analysis, e.g., computing an average, standard deviation, or correlation value, based on more than two tool-log results. In some embodiments, comparing the first tool-log variable results includes applying one or more weights to each of two or more tool-log results or to two or more values, e.g., statistical averages, derived from two or more tool-log results.

In some embodiments, comparing the first tool-log variable results includes comparing the first tool-log variable results based on tool-log variable similarity criteria and using a processing device, e.g., tool-log variable similarity criteria 522 and processor 502, discussed below with respect to IC manufacturing recipe similarity evaluation system 500 and FIG. 5.

At operation 130, a first tool-log variable similarity value is assigned based on the comparison of the first tool-log variable results. In some embodiments, assigning the first tool-log variable similarity value includes selecting one of two values representing a pass/fail result of the comparison, e.g., a first value representing a match within a threshold and a second value representing a match outside the threshold.

In some embodiments, assigning the first tool-log variable similarity value includes selecting one value from a plurality of discrete values, each value representing a result category of the comparison, e.g., a first value representing an exact match, a second value representing a match within a threshold, and a third value representing a match outside the threshold.

In some embodiments, assigning the first tool-log variable similarity value includes assigning a value from a continuous set of values, e.g., a correlation result having any value ranging from 0 to 1.

In some embodiments, assigning the first tool-log variable similarity value includes assigning the first tool-log variable similarity value based on tool-log variable similarity criteria and using a processing device, e.g., tool-log variable similarity criteria 522 and processor 502, discussed below with respect to IC manufacturing recipe similarity evaluation system 500 and FIG. 5.

At optional operation 140, in some embodiments, for a second tool-log variable of the set of tool-log variables, a second tool-log variable result from the first IC manufacturing recipe is compared to a second tool-log variable result from the second IC manufacturing recipe, and a second tool-log variable similarity value is assigned based on the comparison. Comparing the second tool-log variable results is performed in the same manner as comparing the first tool-log variable results, discussed above with respect to operation 120. Assigning the second tool-log variable similarity value is performed in the same manner as assigning the first tool-log variable similarity value, discussed above with respect to operation 130.

In some embodiments, comparing the second tool-log variable results includes each of the second tool-log variable results being different from each of the first tool-log variable results. In some embodiments, comparing the second tool-log variable results includes at least one of the second tool-log variable results being the same as at least one of the first tool-log variable results.

In some embodiments, comparing the second tool-log variable results includes comparing the second tool-log variable results based on tool-log variable similarity criteria and using a processing device, e.g., tool-log variable similarity criteria 522 and processor 502, discussed below with respect to IC manufacturing recipe similarity evaluation system 500 and FIG. 5.

At operation 150, a recipe similarity value is calculated from the first tool-log variable similarity value. In some embodiments, calculating the recipe similarity value includes calculating the recipe similarity value solely from the first tool-log variable similarity value. In some embodiments, calculating the recipe similarity value includes calculating the recipe similarity value from the first tool-log variable similarity value and the second tool-log variable similarity value.

In some embodiments, calculating the recipe similarity value includes calculating the recipe similarity value from tool-log variable similarity values corresponding to an entirety of the set of tool-log variables. In some embodiments, calculating the recipe similarity value includes calculating the recipe similarity value from tool-log variable similarity values corresponding to a subset of the set of tool-log variables.

In some embodiments, calculating the recipe similarity value includes selecting one of two values representing a pass/fail status of the recipe similarity calculation, e.g., a first value representing a recipe similarity status within a threshold and a second value representing a recipe similarity status outside the threshold.

In some embodiments, calculating the recipe similarity value includes selecting one value from a plurality of discrete values, each value representing a category of the status of the recipe similarity calculation, e.g., a first value representing a recipe similarity status exactly matching a predetermined status, a second value representing a recipe similarity status within a threshold, and a third value representing a recipe similarity status outside the threshold.

In some embodiments, calculating the recipe similarity value includes calculating a value within a continuous range of values, e.g., a recipe similarity value representing a correlation between multiple tool-log variable similarity values and having any value ranging from 0 to 1.

In some embodiments, calculating the recipe similarity value includes calculating the recipe similarity value based on recipe similarity criteria and using a processing device, e.g., recipe similarity criteria 524 and processor 502, discussed below with respect to IC manufacturing recipe similarity evaluation system 500 and FIG. 5.

At optional operation 160, in some embodiments, another recipe similarity value is calculated from the recipe similarity value and another tool-log variable similarity value. In some embodiments, calculating another recipe similarity value includes calculating another recipe similarity value only when the recipe similarity value calculated in operation 150 meets a predetermined condition, e.g., a number of manufacturing steps is the same for a first IC manufacturing recipe and a second IC manufacturing recipe.

In some embodiments, operations 150 and 160 are performed in an iterative manner, such that calculating a recipe similarity value for a given iteration based on a number of tool-log variables of the set of tool-log variables is followed by calculating another recipe similarity value based on an increased number of tool-log variables of the set of tool-log variables only if the preceding recipe similarity value meets a predetermined condition. In embodiments performed in this manner, one or more tool-log variables of the set of tool-log variables are thereby prioritized relative to one or more other tool-log variables of the set of tool-log variables.

In some embodiments, calculating another recipe similarity value includes calculating another recipe similarity value based on recipe similarity criteria and using a processing device, e.g., recipe similarity criteria 524 and processor 502, discussed below with respect to IC manufacturing recipe similarity evaluation system 500 and FIG. 5.

At optional operation 170, in some embodiments, one of the first IC manufacturing recipe or the second IC manufacturing recipe is executed on an IC manufacturing tool based on the calculated recipe similarity value. Executing the first IC manufacturing recipe or the second IC manufacturing recipe on the IC manufacturing tool is part of forming one or more IC structures.

In some embodiments, executing the first IC manufacturing recipe or the second IC manufacturing recipe on the IC manufacturing tool includes executing the first IC manufacturing recipe or the second IC manufacturing recipe on the IC manufacturing tool only when the calculated recipe similarity value meets a predetermined condition.

In some embodiments, executing the first IC manufacturing recipe or the second IC manufacturing recipe on the IC manufacturing tool includes executing the first IC manufacturing recipe or the second IC manufacturing recipe on a same IC manufacturing tool used to produce one of the first tool-log result or the second tool-log result. In some embodiments, executing the first IC manufacturing recipe or the second IC manufacturing recipe on the IC manufacturing tool includes executing the first IC manufacturing recipe or the second IC manufacturing recipe on an IC manufacturing tool different from an IC manufacturing tool used to produce one or both of the first tool-log result or the second tool-log result.

In some embodiments, executing the first IC manufacturing recipe or the second IC manufacturing recipe on the IC manufacturing tool includes executing the first IC manufacturing recipe or the second IC manufacturing recipe on one or more IC manufacturing tools 450, discussed below with respect to IC manufacturing environment 400 and FIG. 4.

By executing the operations of method 100, IC manufacturing recipe similarity is evaluated without accessing IC manufacturing recipes, to which access is sometimes restricted for security reasons, and without relying on recipe naming conventions. The automated tool-log based operations of method 100 also reduce engineering time devoted to recipe evaluation, enable flexible criteria to be applied to similarity calculations, and/or are usable to monitor IC manufacturing tool performance. The operations of method 100 are thereby usable to improve IC manufacturing processes used in IC structure formation.

Non-limiting examples of performing some or all of the operations of method 100 are discussed below with respect to FIGS. 2A and 2B and Tables 1-3.

Figures 2A, 2B:
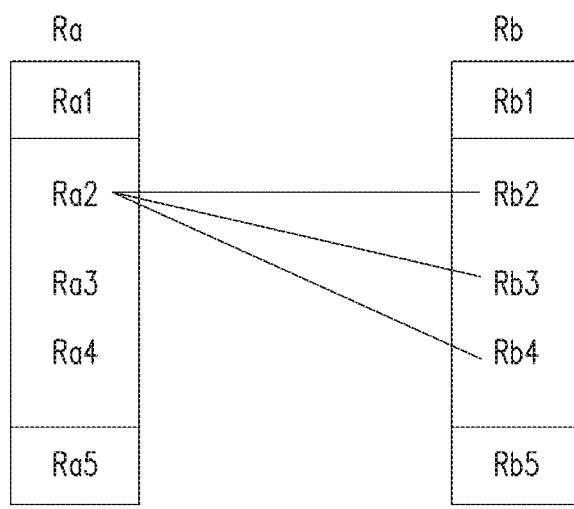
FIG. 2A is a depiction of a non-limiting example of tool-log entries, in accordance with some embodiments.
FIG. 2B is a diagram of a comparison of tool-log entries, in accordance with some embodiments.

FIG. 2A is a depiction of a non-limiting example of tool-log entries, in accordance with some embodiments. FIG. 2A depicts eleven tool-log entries P1-P11 in a single tool-log corresponding to performing processing steps on an IC manufacturing tool including a thermal chamber, e.g., performing an oxide growth process.

The example depicted in FIG. 2A is simplified for illustration. In some embodiments, one or more tool-logs include fewer than eleven tool-log entries. In some embodiments, one or more tool-logs include greater than eleven tool-log entries.

Tool-log entries P1, P2, P10, and P11 correspond to loading and unloading operations for one or more substrates on which one or more IC structures are formed, in part, by an IC manufacturing recipe executed on the IC manufacturing tool.

Tool-log entries P3 and P4 represent IC manufacturing tool settings for a chamber oxygen concentration level and temperature, respectively, and tool-log entries P5 and P9 represent start and stop times, respectively, for execution of the oxide growth process.

Tool-log entries P6 and P7 represent IC manufacturing tool measurements of chamber oxygen concentration level and temperature, respectively, and tool-log entry P8 represents one or more IC manufacturing tool measurements of oxide thickness. In some embodiments, a set of tool-log variables corresponds to two or more of tool-log entries P3-P9, which represent IC manufacturing recipe dependent activities, and does not correspond to tool-log entries P1, P2, P10, and P11, which represent material handling activities common to execution of any IC manufacturing recipe on the IC manufacturing tool.

In some embodiments, a tool-log variable of the set of tool-log variables is the temperature setting, corresponding to the individual tool-log entry P4. In some embodiments, a tool-log variable of the set of tool-log variables is a difference between set and measured temperatures, corresponding to tool-log entries P4 and P7, respectively. In some embodiments, a tool-log variable of the set of tool-log variables is a ratio of measured oxide thickness to oxide thickness predicted by oxygen concentration, temperature, and duration settings, corresponding to tool-log entries P8, P3, P4, P5, and P9, respectively.

In some embodiments, the tool-log entries depicted in FIG. 2A are tool-log entries for a single substrate of a plurality of substrates, the tool-log includes additional tool-log entries (not shown), and a tool-log variable of the set of tool-log variables is an average of oxide thickness values, corresponding to tool-log entry P8 and one or more additional tool-log entries.

In some embodiments, a tool-log variable of the set of tool-log variables is a number of steps required to execute an oxide growth process on the IC processing tool, corresponding to the four tool-log entries P3-P5 and P9.

Table 1 illustrates a non-limiting example in which each of five IC manufacturing recipes R1-R5 listed in the first column has a number of steps listed in the second column.

TABLE 1

| Recipe | Number of Steps |
|--------|-----------------|
| R1 | 8 |
| R2 | 15 |
| R3 | 8 |
| R4 | 16 |
| R5 | 16 |

Table 2 illustrates a non-limiting example based on IC manufacturing recipes R1-R5 in which the number of steps in an IC manufacturing recipe is defined as a first tool-log variable. A tool-log variable similarity value of 1 corresponds to an equal number of steps and a tool-log variable similarity value of 0 corresponds to an unequal number of steps.

TABLE 2

|  | R1 | R2 | R3 | R4 | R5 |
|---|---|---|---|---|---|
| R1 | 1 | 0 | 1 | 0 | 0 |
| R2 | 0 | 1 | 0 | 0 | 0 |
| R3 | 1 | 0 | 1 | 0 | 0 |
| R4 | 0 | 0 | 0 | 1 | 1 |
| R5 | 0 | 0 | 0 | 1 | 1 |

In this example, the tool-log variable similarity value of 1 corresponds to each of IC manufacturing recipes R1 and R3 having eight steps, each of IC manufacturing recipes R4 and R5 having 16 steps, and each of manufacturing recipes R1-R5 having a same number of steps if executed multiple times.

Table 3 illustrates a non-limiting example based on IC manufacturing recipes R1 and R2 in which tool-log variable similarity values are assigned for tool-log results corresponding to four IC manufacturing recipe steps.

TABLE 3

|  | Step Time | VS1 | VS2 | VSN |
|---|---|---|---|---|
| Step 1 | 0 | 0.9388 | 1.204 | 1.1594 |
| Step 2 | 0 | 0.0238 | 0.529 | 1.0997 |
| Step 3 | 1 | 0.6742 | 1.3082 | 0.2899 |
| Step 4 | 0 | 0.3244 | 1.3784 | 1.7061 |

In this example, a set of tool-log variables for a recipe similarity evaluation includes the number of steps, Step Time, VS1, VS2, and VSN. A Step Time similarity value of 1 represents an overall duration for a given step agreeing to within a threshold value for IC manufacturing recipes R1 and R2, and a Step Time similarity value of 0 represents an overall duration for the given step being at or outside the threshold value.

Tool-log variable similarity values VS1, VS2, and VSN have decimal values ranging from 0.0 to 2.0 based on a statistical analysis of multiple tool-log results corresponding to a given step. In this example, a tool-log variable similarity value above a threshold value of 1.0 is used to conclude that the multiple tool-log results correspond to similarity between IC manufacturing recipes R1 and R2.

In a non-limiting example, a recipe similarity value is calculated for IC manufacturing recipes R1 and R2 in which a recipe similarity value of 1 corresponds to IC manufacturing recipe R1 being similar to IC manufacturing recipe 2, and a recipe similarity value of 0 corresponds to IC manufacturing recipe R1 not being similar to IC manufacturing recipe 2.

In this example, depending on recipe similarity evaluation criteria, the recipe similarity value is calculated based on any one or a combination of the tool-log variable similarity values for the number of steps, Step Time, VS1, VS2, or VSN.

In another example, a first recipe similarity value is determined based solely on the number of steps and is calculated as 1 based on a tool-log variable similarity value of 1 for the number of steps. A second recipe similarity value is then calculated only when the first recipe similarity value is 1, the second recipe similarity value being further based on any one or a combination of the tool-log variable similarity values for the Step Time, VS1, VS2, or VSN.

FIG. 2B is a diagram of a comparison of tool-log entries, in accordance with some embodiments. A first column represents a list of tool-log results Ra1-Ra5 based on execution of an IC manufacturing recipe Ra, and a second column represents a list of tool-log results Rb1-Rb5 based on execution of a different IC manufacturing recipe Rb.

In the embodiment depicted in FIG. 2B, execution of each of IC manufacturing recipes Ra and Rb includes five steps. In some embodiments, execution of one or both of IC manufacturing recipes Ra and Rb includes fewer than five steps. In some embodiments, execution of one or both of IC manufacturing recipes Ra and Rb includes greater than five steps.

In the embodiment depicted in FIG. 2B, each of tool-log results Ra1, Ra5, Rb1, and Rb5 represents an IC manufacturing tool activity, e.g., air-lock or chamber door control, that is not dependent on IC manufacturing recipe Ra or Rb. Each set of tool-log results Ra2-Ra4 and Rb2-Rb4 represents IC manufacturing tool settings and/or readings, e.g., temperature or pressure, dependent on each of IC manufacturing recipes Ra and Rb and executed in a loop, e.g., for three substrates on which IC structures are being formed by IC manufacturing tool activity.

A set of variables for tool-log results Ra1-Ra5 and Rb1-Rb5 is used to identify tool-log results Ra2-Ra4 and Rb2-Rb4 as results to be compared as part of an IC manufacturing recipe similarity evaluation. The evaluation is then performed based on recipe similarity evaluation criteria that define which tool-log comparisons are made.

In a first example, tool-log results Ra2 are compared to each of tool-log results Rb2-Rb4, indicated by the lines in FIG. 2. Depending on the recipe similarity evaluation criteria, a tool-log variable similarity value is assigned based on an averaged value from the Ra2-Rb2, Ra2-Rb3, and Ra2-Rb4 comparisons, or on a maximum value selected from each comparison. A recipe similarity value is then calculated based, at least in part, on the resultant tool-log variable similarity value.

In another example (not shown), tool-log results Ra2 are compared to each of tool-log results Ra3 and Ra4 and a tool-log variable similarity result is similarly assigned. In this case, because the tool-log results are generated based on multiple executions of a single IC manufacturing recipe on a single IC manufacturing tool, a recipe similarity value calculated, at least in part, from the tool-log variable similarity result is usable to evaluate IC manufacturing tool performance.

Figure 3:
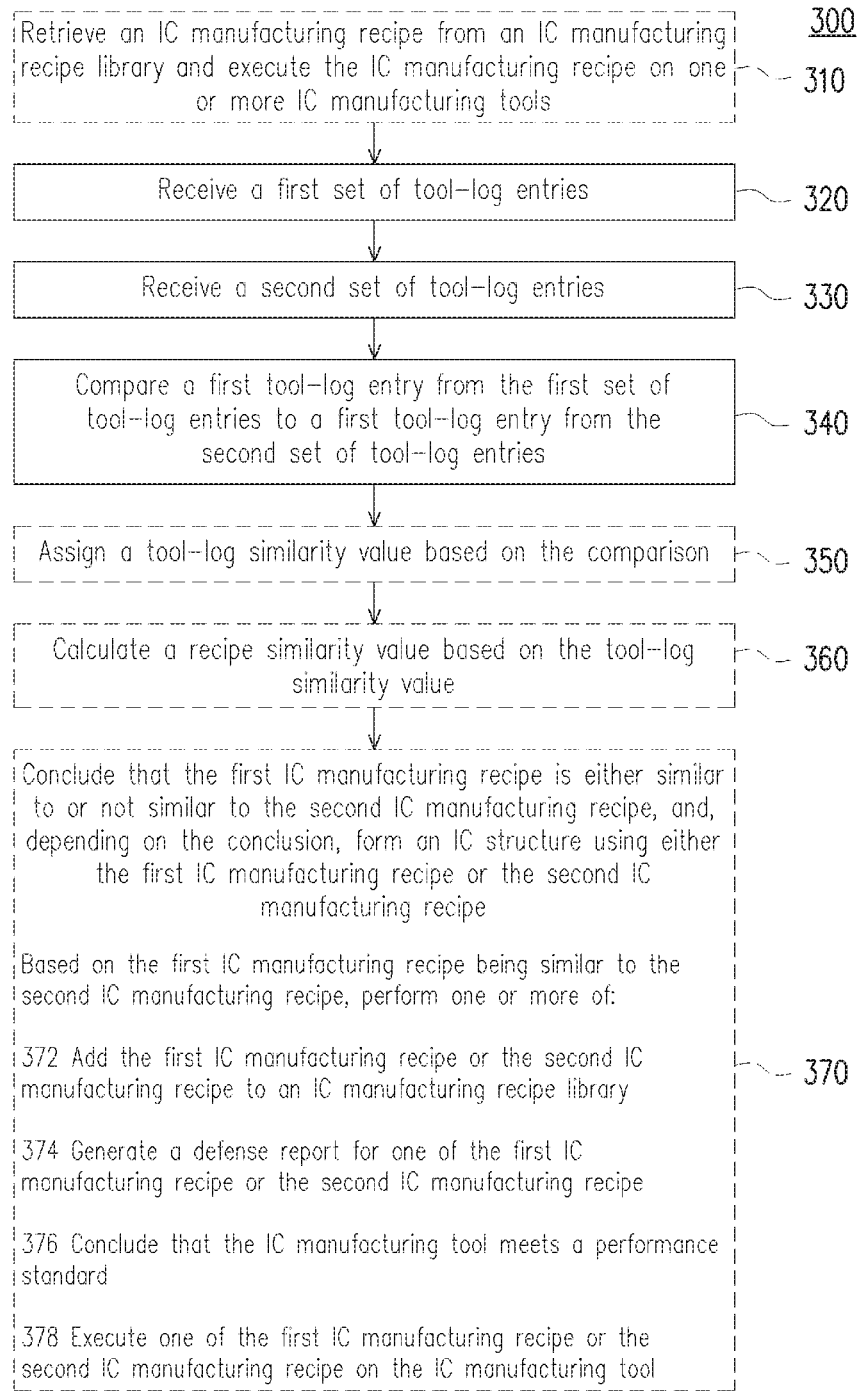
FIG. 3 is a flowchart of a method of evaluating IC manufacturing recipe similarity, in accordance with some embodiments.

FIG. 3 is a flowchart of a method 300 of evaluating IC manufacturing recipe similarity, in accordance with one or more embodiments. In some embodiments, some or all of method 300 is implemented using a system for evaluating IC manufacturing recipe similarity such as IC manufacturing recipe similarity evaluation system 410 in IC manufacturing environment 400, discussed below with respect to FIG. 4.

The sequence in which the operations of method 300 are depicted in FIG. 3 is for illustration only; the operations of method 300 are capable of being executed in sequences that differ from that depicted in FIG. 3. In some embodiments, operations in addition to those depicted in FIG. 3 are performed before, between, and/or after the operations depicted in FIG. 3. In some embodiments, the operations of method 300 are a subset of operations of one or more methods of manufacturing one or more IC structures.

At optional operation 310, in some embodiments, an IC manufacturing recipe is retrieved from an IC manufacturing recipe library and executed on one or more IC manufacturing tools to generate a set of tool-log entries. In some embodiments, executing the IC manufacturing recipe on the one or more IC manufacturing tools comprises forming one or more IC structures.

IC manufacturing recipes, IC manufacturing recipe libraries, IC manufacturing tools, and tool-log entries are discussed above with respect to method 100 and FIG. 1. In some embodiments, executing the IC manufacturing recipe on the one or more IC manufacturing tools comprises executing the IC manufacturing recipe on one or more IC manufacturing tools 450 in IC manufacturing environment 400, discussed below with respect to FIG. 4.

At operation 320, a first set of tool-log entries based on execution of a first IC manufacturing recipe on an IC manufacturing tool is received. In some embodiments, receiving the first set of tool-log entries comprises receiving the set of tool-log entries generated in operation 310.

In some embodiments, receiving the first set of tool-log entries comprises receiving the first set of tool-log entries in response to one or more user commands received through a user interface. In some embodiments, receiving the first set of tool-log entries comprises receiving the first set of tool-log entries in response to one or more automated instructions received from a logic device, e.g., a controller. In some embodiments, receiving the first set of tool-log entries comprises receiving the first set of tool-log entries in response to one or more automated instructions received over a network.

In some embodiments, receiving the first set of tool-log entries comprises receiving the first set of tool-log entries using an IC manufacturing recipe similarity evaluation system, e.g., IC manufacturing recipe similarity evaluation system 410, discussed below with respect to IC manufacturing environment 400 and FIG. 4. In some embodiments, receiving the first set of tool-log entries comprises receiving the first set of tool-log entries from tool-log storage device 440 over a communications network 420 using IC manufacturing recipe similarity evaluation system 410 in IC manufacturing environment 400, discussed below with respect to FIG. 4.

At operation 330, a second set of tool-log entries based on execution of a second IC manufacturing recipe on the IC manufacturing tool is received. In some embodiments, receiving the second set of tool-log entries comprises receiving the set of tool-log entries generated in operation 310.

In some embodiments, receiving the second set of tool-log entries comprises receiving the second set of tool-log entries in response to one or more user commands received through a user interface. In some embodiments, receiving the second set of tool-log entries comprises receiving the second set of tool-log entries in response to one or more automated instructions received from a logic device, e.g., a controller. In some embodiments, receiving the second set of tool-log entries comprises receiving the second set of tool-log entries in response to one or more automated instructions received over a network.

In some embodiments, receiving the second set of tool-log entries comprises receiving the second set of tool-log entries using an IC manufacturing recipe similarity evaluation system, e.g., IC manufacturing recipe similarity evaluation system 410, discussed below with respect to IC manufacturing environment 400 and FIG. 4. In some embodiments, receiving the second set of tool-log entries comprises receiving the second set of tool-log entries from tool-log storage device 440 over communications network 420 using IC manufacturing recipe similarity evaluation system 410 in IC manufacturing environment 400, discussed below with respect to FIG. 4.

At operation 340, a first tool-log entry from the first set of tool-log entries is compared to a first tool-log entry from the second set of tool-log entries. Comparing tool-log entries is performed in the manner of comparing tool-log results discussed above with respect to operations 120 and 140 of method 100 and FIG. 1.

In some embodiments, comparing the first tool-log entries is performed in response to one or more user commands received through a user interface. In some embodiments, comparing the first tool-log entries comprises comparing the first tool-log entries in response to one or more automated instructions received from a logic device, e.g., a controller. In some embodiments, comparing the first tool-log entries comprises comparing the first tool-log entries in response to one or more automated instructions received over a network.

In some embodiments, comparing the first tool-log entries comprises comparing the first tool-log entries using an IC manufacturing recipe similarity evaluation system, e.g., IC manufacturing recipe similarity evaluation system 410 in IC manufacturing environment 400, discussed below with respect to FIG. 4.

In some embodiments, comparing the first tool-log entries comprises selecting the first tool-log entry from the first set of tool-log entries based on a set of tool-log variables, and selecting the first tool-log entry from the second set of tool-log entries based on the set of tool-log variables. Selecting tool-log entries based on a set of tool-log variables is performed in the manner discussed above with respect to method 100, FIGS. 1 and 2, and Tables 1-3.

In some embodiments, comparing the first tool-log entries comprises receiving the set of tool-log variables. In some embodiments, receiving the set of tool-log variables comprises receiving the set of tool-log variables in response to one or more user commands received through a user interface. In some embodiments, receiving the set of tool-log variables comprises receiving the set of tool-log variables in response to one or more automated instructions received from a logic device, e.g., a controller. In some embodiments, receiving the set of tool-log variables comprises receiving the set of tool-log variables in response to one or more automated instructions received over a network.

In some embodiments, receiving the set of tool-log variables comprises receiving the set of tool-log variables using an IC manufacturing recipe similarity evaluation system, e.g., IC manufacturing recipe similarity evaluation system 410, discussed below with respect to IC manufacturing environment 400 and FIG. 4. In some embodiments, receiving the set of tool-log variables comprises receiving the set of tool-log variables over communications network 420 using IC manufacturing recipe similarity evaluation system 410 in IC manufacturing environment 400, discussed below with respect to FIG. 4.

At optional operation 350, a tool-log similarity value is assigned based on the comparison of the first tool-log entries. Assigning tool-log similarity values is performed in the manner of assigning tool-log variable similarity values discussed above with respect to method 100, FIGS. 1 and 2, and Tables 1-3.

In some embodiments, assigning the tool-log similarity value is performed in response to one or more user commands received through a user interface. In some embodiments, assigning the tool-log similarity value comprises assigning the tool-log similarity value in response to one or more automated instructions received from a logic device, e.g., a controller. In some embodiments, assigning the tool-log similarity value comprises assigning the tool-log similarity value in response to one or more automated instructions received over a network.

In some embodiments, assigning the tool-log similarity value comprises assigning the tool-log similarity value using an IC manufacturing recipe similarity evaluation system, e.g., IC manufacturing recipe similarity evaluation system 410 in IC manufacturing environment 400, discussed below with respect to FIG. 4.

At optional operation 360, a recipe similarity value is calculated based on the tool-log similarity value. Calculating recipe similarity values is performed in the manner discussed above with respect to method 100, FIGS. 1 and 2, and Tables 1-3.

In some embodiments, calculating the recipe similarity value is performed in response to one or more user commands received through a user interface. In some embodiments, calculating the recipe similarity value comprises calculating the recipe similarity value in response to one or more automated instructions received from a logic device, e.g., a controller. In some embodiments, calculating the recipe similarity value comprises calculating the recipe similarity value in response to one or more automated instructions received over a network.

In some embodiments, calculating the recipe similarity value comprises calculating the recipe similarity value using an IC manufacturing recipe similarity evaluation system, e.g., IC manufacturing recipe similarity evaluation system 410 in IC manufacturing environment 400, discussed below with respect to FIG. 4.

At optional operation 370, in some embodiments, based on the recipe similarity value, a conclusion is reached that the first IC manufacturing recipe is either similar to or not similar to the second IC manufacturing recipe.

In some embodiments, concluding that the first IC manufacturing recipe is either similar to or not similar to the second IC manufacturing recipe comprises concluding that the first IC manufacturing recipe is either similar to or not similar to the second IC manufacturing recipe using an IC manufacturing recipe similarity evaluation system, e.g., IC manufacturing recipe similarity evaluation system 410 in IC manufacturing environment 400, discussed below with respect to FIG. 4.

In some embodiments, concluding that the first IC manufacturing recipe is either similar to or not similar to the second IC manufacturing recipe is based on recipe similarity criteria, e.g., recipe similarity criteria 524, discussed below with respect to IC manufacturing recipe similarity evaluation system 500 and FIG. 5.

In some embodiments, based on a conclusion that the first IC manufacturing recipe is similar to the second IC manufacturing recipe, concluding that the first IC manufacturing recipe is either similar to or not similar to the second IC manufacturing recipe comprises performing one or more of operations 372, 374, 376, or 378.

In some embodiments, the one or more of operations 372, 374, 376, or 378 are performed using an IC manufacturing recipe similarity evaluation system, e.g., IC manufacturing recipe similarity evaluation system 410 in IC manufacturing environment 400, discussed below with respect to FIG. 4.

In some embodiments, performing one or more of operations 372, 374, 376, or 378 is based on IC manufacturing environment instructions, e.g., IC manufacturing environment instructions 526, discussed below with respect to IC manufacturing recipe similarity evaluation system 500 and FIG. 5.

In some embodiments, depending on the conclusion, an IC structure is formed using either the first IC manufacturing recipe or the second IC manufacturing recipe. In a non-limiting example, the first set of tool-log entries is based on a production run of the first IC manufacturing recipe, and, based on a conclusion that the first IC manufacturing recipe is similar to the second IC manufacturing recipe, the IC structure is formed using the second IC manufacturing recipe in a production run.

In another non-limiting example, the first set of tool-log entries is based on a production run of the first IC manufacturing recipe, and, based on a conclusion that the first IC manufacturing recipe is not similar to the second IC manufacturing recipe, the IC structure is formed using the second IC manufacturing recipe as part of development activity directed to improving IC manufacturing operations.

At operation 372, in some embodiments, based on a conclusion that the first IC manufacturing recipe is similar to the second IC manufacturing recipe, instructions are generated to add one of the first IC manufacturing recipe or the second IC manufacturing recipe to an IC manufacturing recipe library.

In some embodiments, generating instructions to add one of the first IC manufacturing recipe or the second IC manufacturing recipe to an IC manufacturing recipe library comprises generating instructions configured to be executed using IC manufacturing recipe storage device 430 in IC manufacturing environment 400, discussed below with respect to FIG. 4.

In some embodiments, generating instructions to add one of the first IC manufacturing recipe or the second IC manufacturing recipe to an IC manufacturing recipe library comprises transmitting the instructions over a network, e.g., communications network 420 in IC manufacturing environment 400, discussed below with respect to FIG. 4.

At operation 374, in some embodiments, based on a conclusion that the first IC manufacturing recipe is similar to the second IC manufacturing recipe, a defense, or justification, report is generated for one of the first IC manufacturing recipe or the second IC manufacturing recipe based on an existing defense record of the other of the first IC manufacturing recipe or the second IC manufacturing recipe.

In some embodiments, generating a defense report comprises generating and/or outputting a report including evidence justifying production use of an IC manufacturing recipe, e.g., by demonstrating that an IC structure formed based on the IC manufacturing recipe meets one or more tolerance levels. In some embodiments, generating a defense report comprises generating a defense report based on recipe similarity criteria, e.g., recipe similarity criteria 524, discussed below with respect to IC manufacturing recipe similarity evaluation system 500 and FIG. 5.

In some embodiments, generating a defense report comprises generating instructions configured to be executed using IC manufacturing recipe storage device 430 in IC manufacturing environment 400, discussed below with respect to FIG. 4.

In some embodiments, generating a defense report comprises transmitting instructions or formatted evidence over a network, e.g., communications network 420 in IC manufacturing environment 400, discussed below with respect to FIG. 4. In some embodiments, generating a defense comprises outputting formatted evidence to a user interface.

At operation 376, in some embodiments, the first IC manufacturing recipe and the second IC manufacturing recipe are a same IC manufacturing recipe, and, based on a conclusion that the first IC manufacturing recipe is similar to the second IC manufacturing recipe, a conclusion is reached that the IC manufacturing tool meets a performance standard.

In some embodiments, concluding that the IC manufacturing tool meets a performance standard comprises concluding that one or more IC manufacturing tools 450 in IC manufacturing environment 400, discussed below with respect to FIG. 4, meet one or more performance standards.

In some embodiments, concluding that the IC manufacturing tool meets a performance standard comprises generating and/or transmitting an indication of the conclusion over a network, e.g., communications network 420 in IC manufacturing environment 400, discussed below with respect to FIG. 4. In some embodiments, concluding that the IC manufacturing tool meets a performance standard comprises outputting an indication of the conclusion to a user interface.

At operation 378, in some embodiments, based on a conclusion that the first IC manufacturing recipe is similar to the second IC manufacturing recipe, one of the first IC manufacturing recipe or the second IC manufacturing recipe is executed on the IC manufacturing tool.

In some embodiments, executing one of the first IC manufacturing recipe or the second IC manufacturing recipe on the IC manufacturing tool comprises executing one of the first IC manufacturing recipe or the second IC manufacturing recipe on one or more IC manufacturing tools 450 in IC manufacturing environment 400, discussed below with respect to FIG. 4.

By executing the operations of method 300, IC manufacturing recipe similarity is evaluated without accessing IC manufacturing recipes, to which access is sometimes restricted for security reasons, and without relying on recipe naming conventions. The automated tool-log based operations of method 300 also reduce engineering time devoted to recipe evaluation, enable flexible criteria to be applied to similarity calculations, and/or are usable to monitor IC manufacturing tool performance. The operations of method 300 are thereby usable to improve IC manufacturing processes used in IC structure formation.

Figure 4:
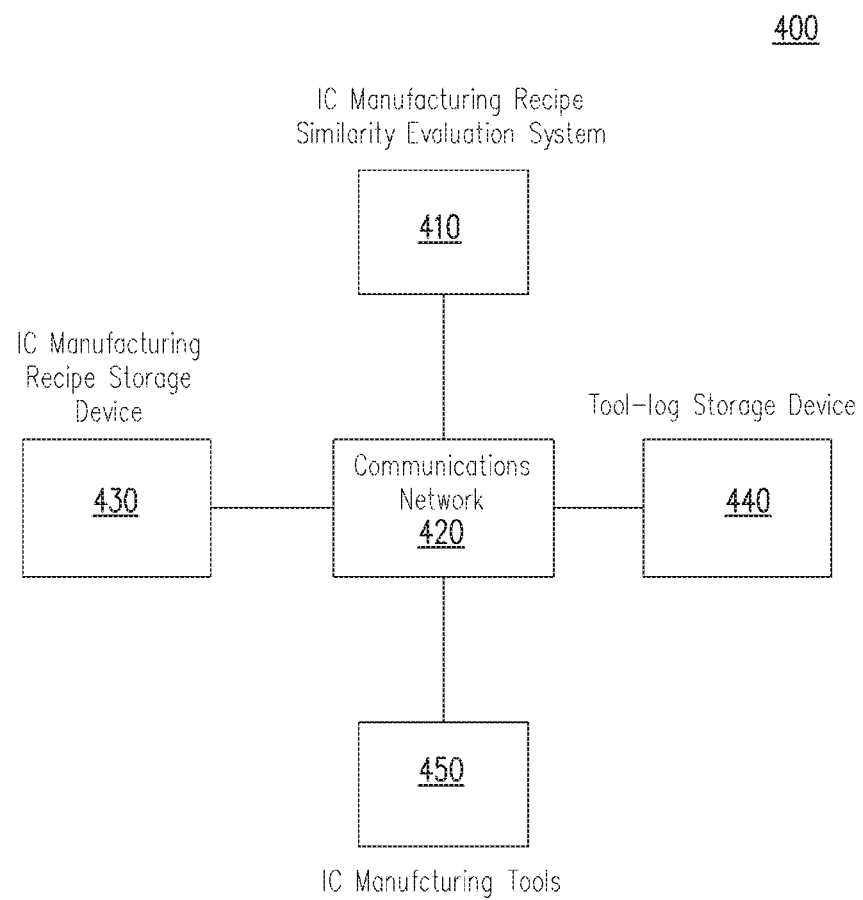
FIG. 4 is a block diagram of an IC manufacturing environment including an IC manufacturing recipe similarity evaluation system, in accordance with some embodiments.

FIG. 4 is a block diagram of IC manufacturing environment 400, in accordance with some embodiments. IC manufacturing environment 400 includes IC manufacturing recipe similarity evaluation system 410, communications network 420, IC manufacturing recipe storage device 430, tool-log storage device 440, and one or more IC manufacturing tools 450.

IC manufacturing environment 400 is a simplified representation of a manufacturing environment in which certain elements relevant to the present disclosure are included. In some embodiments, IC manufacturing environment 400 includes additional elements (not shown).

IC manufacturing recipe similarity evaluation system 410 is one or more computing devices based on one or more processors or other logic circuits and configured to execute some or all of the operations of method 100, discussed above with respect to FIG. 1, and/or some or all of method 300, discussed above with respect to FIG. 3.

Communications network 420 communicatively couples IC manufacturing recipe similarity evaluation system 410 to IC manufacturing recipe storage device 430, tool-log storage device 440, and one or more IC manufacturing tools 450. In some embodiments, communications network 420 communicatively couples IC manufacturing recipe similarity evaluation system 410 to additional elements in IC manufacturing environment 400.

Communications network 420 includes wired and/or wireless communication channels. In some embodiments, communications network 420 is a single network. In some embodiments, communications network 420 is a variety of different networks, such as an intranet and the Internet.

IC manufacturing recipe storage device 430 is one or more electronic assemblies comprising one or more non-transitory storage media configured to store, update, and/or retrieve one or more IC manufacturing recipes, as discussed above with respect to methods 100 and 300 and FIGS. 1 and 3.

Tool-log storage device 440 is one or more electronic assemblies comprising one or more non-transitory storage media configured to store, update, and/or retrieve one or more tool-logs, as discussed above with respect to methods 100 and 300 and FIGS. 1 and 3.

One or more IC manufacturing tools 450 are one or more mechanical, electromechanical, electronic, or other assemblies configured to perform one or more IC manufacturing functions, as discussed above with respect to methods 100 and 300 and FIGS. 1 and 3.

By operating in an IC manufacturing environment, e.g., IC manufacturing environment 400, and executing some or all of methods 100 and 300, IC manufacturing recipe similarity evaluation system 410 is part of an integrated development and manufacturing environment in which the IC manufacturing improvements discussed above with respect to methods 100 and 300 and FIGS. 1 and 3 are realized.

Figure 5:
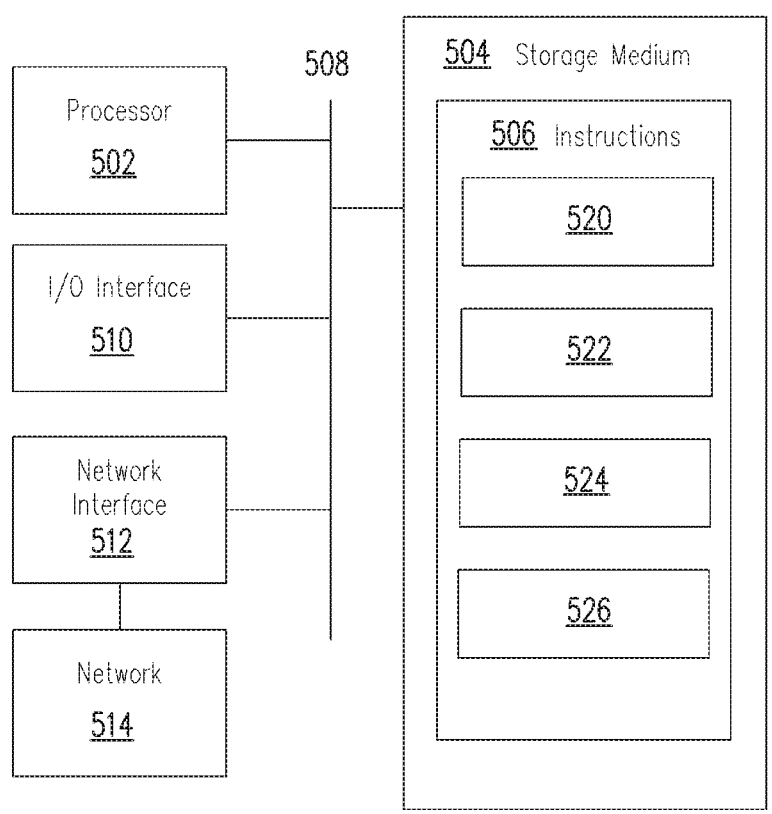
FIG. 5 is a schematic view of an IC manufacturing recipe similarity evaluation system, in accordance with some embodiments.

FIG. 5 is a schematic view of an IC manufacturing recipe similarity evaluation system 500, in accordance with some embodiments. In some embodiments, IC manufacturing recipe similarity evaluation system 500 is usable as IC manufacturing recipe similarity evaluation system 410 of IC manufacturing environment 400, discussed above with respect to FIG. 4. In some embodiments, IC manufacturing recipe similarity evaluation system 500 is capable of performing some or all of the operations of method 100, discussed above with respect to FIG. 1, and/or some or all of method 300, discussed above with respect to FIG. 3.

IC manufacturing recipe similarity evaluation system 500 includes a hardware processor 502 and a non-transitory, computer readable storage medium 504 encoded with, i.e., storing, the computer program instructions 506, i.e., a set of executable instructions. Instructions 506 include instructions for evaluating IC manufacturing recipe similarity and generating instructions for an IC manufacturing environment. The processor 502 is electrically coupled with the computer readable storage medium 504 via a bus 508. The processor 502 is also electrically coupled with an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program instructions 506 encoded in the computer readable storage medium 504 in order to cause IC manufacturing recipe similarity evaluation system 500 to be usable for performing a portion or all of the operations as described in methods 100 and 300.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device) for storing instructions and/or data in a non-transitory manner. For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the computer readable storage medium 504 stores the computer program instructions 506 configured to cause IC manufacturing recipe similarity evaluation system 500 to perform a portion or all of methods 100 and 300. In some embodiments, the computer readable storage medium 504 also stores information needed for performing methods 100 and/or 300 as well as information generated during the performance of the methods 100 and/or 300, such as one or more sets of tool-log variables 520, tool-log variable similarity criteria 522, recipe similarity criteria 524, IC manufacturing environment instructions 526, and/or a set of executable instructions to perform one or more operations of methods 100 and 300.

I/O interface 510 is coupled with external circuitry. In some embodiments, I/O interface 510 includes a keyboard, keypad, mouse, trackball, trackpad, and/or cursor direction keys for communicating information and/or commands to processor 502. In some embodiments, I/O interface 510 includes a display, signal light, and/or audio device for communicating information from processor 502.

Network interface 512 allows IC manufacturing recipe similarity evaluation system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, one or both of methods 100 or 300 is implemented in two or more IC manufacturing recipe similarity evaluation systems 500, and information such as one or more sets of tool-log variables 520, tool-log variable similarity criteria 522, recipe similarity criteria 524, or IC manufacturing environment instructions 526 are exchanged between different systems 500 via network 514.

IC manufacturing recipe similarity evaluation system 500 is configured to receive information related to evaluating IC manufacturing recipe similarity and generating IC manufacturing environment instructions. The information is transferred to processor 502 via bus 508 and is then stored in computer readable storage medium 504 as one or more sets of tool-log variables 520, tool-log variable similarity criteria 522, recipe similarity criteria 524, or IC manufacturing environment instructions 526. In some embodiments, the one or more sets of tool-log variables 520 are accessed in operation 110 (FIG. 1) and/or operation 340 (FIG. 3). In some embodiments, the tool-log variable similarity criteria 522 are accessed in operations 130 and 140 (FIG. 1) and/or operation 350 (FIG. 3). In some embodiments, the recipe similarity criteria 524 are accessed in operations 150 and 160 (FIG. 1) and/or operation 360 (FIG. 3). In some embodiments, IC manufacturing environment instructions 526 are accessed in operation 170 (FIG. 1) and/or operation 370 (FIG. 3).

By being configured to execute a portion or all of methods 100 and 300, IC manufacturing recipe similarity evaluation system 500 enables the realization of the advantages discussed above with respect to methods of evaluating IC manufacturing recipe similarity 100 and 300 and FIGS. 1 and 3.

In some embodiments, a method includes, for a first tool-log variable of a set of tool-log variables, comparing a first tool-log variable result from a first integrated circuit (IC) manufacturing recipe to a first tool-log variable result from a second IC manufacturing recipe, wherein the set of tool-log variables corresponds to one or more tool-logs generated from execution of the first IC manufacturing recipe and the second IC manufacturing recipe on an IC manufacturing tool. Based on the comparison, a first tool-log variable similarity value is assigned for the first tool-log variable, and, based on the first tool-log variable similarity value, a recipe similarity value is calculated for the first IC manufacturing recipe and the second IC manufacturing recipe. At least one of comparing the first tool-log variable result from the first IC manufacturing recipe to the first tool-log variable result from the second IC manufacturing recipe, assigning the first tool-log variable similarity value, or calculating the recipe similarity value is performed by a processing device.

In some embodiments, a method includes receiving a first set of tool-log entries based on execution of a first integrated circuit (IC) manufacturing recipe on an IC manufacturing tool, receiving a second set of tool-log entries based on execution of a second IC manufacturing recipe on the IC manufacturing tool, and comparing a first tool-log entry from the first set of tool-log entries to a first tool-log entry from the second set of tool-log entries. Based on the comparison, an IC structure is formed using either the first IC manufacturing recipe or the second IC manufacturing recipe.

In some embodiments, an IC manufacturing recipe similarity evaluation system includes a processor and a non-transitory, computer readable storage medium including computer program code for one or more programs. The non-transitory, computer readable storage medium and the computer program code are configured to, with the processor, cause the system to retrieve a first set of tool-log entries and a second set of tool-log entries from a tool-log storage device, the first set of tool-log entries corresponding to executing a first IC manufacturing recipe on an IC manufacturing tool, the second set of tool-log entries corresponding to executing a second IC manufacturing recipe on the IC manufacturing tool, and receive a tool-log variable identifying a first entry of the first set of tool-log entries and a first entry of the second set of tool-log entries. The non-transitory, computer readable storage medium and the computer program code are configured to, with the processor, further cause the system to assign a tool-log variable similarity value for the first tool-log entry of the first set of tool-log entries and the first tool-log entry of the second set of tool-log tool-log entries, and based on the tool-log variable similarity value, calculate a recipe similarity value for the first IC manufacturing recipe and the second IC manufacturing recipe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   for a first tool-log variable of a set of tool-log variables, comparing a first tool-log variable result from a first integrated circuit (IC) manufacturing recipe to a first tool-log variable result from a second IC manufacturing recipe, wherein the first and second tool-log variable results are obtained from one or more tool-logs generated from execution of the first IC manufacturing recipe and the second IC manufacturing recipe on an IC manufacturing tool as part of fabricating one or more IC structures;
   based on the comparison, assigning a first tool-log variable similarity value for the first tool-log variable;
   based on the first tool-log variable similarity value, calculating a recipe similarity value for the first IC manufacturing recipe and the second IC manufacturing recipe,
   wherein at least one of the comparing the first tool-log variable result from the first IC manufacturing recipe to the first tool-log variable result from the second IC manufacturing recipe, the assigning the first tool-log variable similarity value, or the calculating the recipe similarity value is performed by a processing device; and
   based on the calculated recipe similarity value meeting a predetermined condition, executing the first IC manufacturing recipe or the second IC manufacturing recipe on the IC manufacturing tool as part of forming an IC structure.

2. The method of claim 1, wherein
   the IC manufacturing tool is one IC manufacturing tool of a plurality of IC manufacturing tools, and
   the set of tool-log variables includes tool-log variables corresponding to more than one IC manufacturing tool of the plurality of IC manufacturing tools.

3. The method of claim 1, wherein the first tool-log variable of the set of tool-log variables comprises a number of IC manufacturing recipe steps or a duration of one or more IC manufacturing steps.

4. The method of claim 1, wherein the calculating the recipe similarity value comprises comparing the first variable similarity value to a threshold value.

5. The method of claim 1, further comprising, for each additional tool-log variable of the set of tool-log variables:
   comparing an additional tool-log variable result from the first IC manufacturing recipe to an additional tool-log variable result from the second IC manufacturing recipe; and
   assigning an additional tool-log variable similarity value for the additional tool-log variable,
   wherein the calculating the recipe similarity value is based on the additional tool-log variable similarity value for each additional tool-log variable of the set of tool-log variables.

6. The method of claim 1, further comprising:
   calculating another recipe similarity value based on the recipe similarity value and a second tool-log variable similarity value for a second tool-log variable of the set of tool-log variables.

7. A method comprising:
   receiving a first set of tool-log entries obtained from execution of a first integrated circuit (IC) manufacturing recipe on an IC manufacturing tool, wherein the execution of the first IC manufacturing recipe includes forming one or more IC structures;
   receiving a second set of tool-log entries obtained from execution of a second IC manufacturing recipe on the IC manufacturing tool, wherein the execution of the second IC manufacturing recipe includes forming one or more IC structures;
   comparing a first tool-log entry from the first set of tool-log entries to a first tool-log entry from the second set of tool-log entries; and
   based on the comparison, forming an IC structure using either the first IC manufacturing recipe or the second IC manufacturing recipe.

8. The method of claim 7, further comprising:
   retrieving one of the first IC manufacturing recipe or the second IC manufacturing recipe from an IC manufacturing recipe library; and
   executing the one of the first IC manufacturing recipe or the second IC manufacturing recipe on the IC manufacturing tool to generate the corresponding first set of tool-log entries or second set of tool-log entries.

9. The method of claim 7, wherein the comparing the first tool-log entry to the second tool-log entry comprises:
   selecting the first tool-log entry from the first set of tool-log entries based on a set of tool-log variables; and
   selecting the second tool-log entry from the second set of tool-log entries based on the set of tool-log variables.

10. The method of claim 7, further comprising:
    based on the comparison of the first tool-log entry from the first set of tool-log entries to the first tool-log entry from the second set of tool-log entries, assigning a tool-log similarity value for the first tool-log entry from the first set of tool-log entries and the first tool-log entry from the second set of tool-log entries;
    based on the similarity value, calculating a recipe similarity value for the first IC manufacturing recipe and the second IC manufacturing recipe; and
    concluding that the first IC manufacturing recipe is similar to the second IC manufacturing recipe based on the recipe similarity value.

11. The method of claim 10, further comprising:
based on the concluding that the first IC manufacturing recipe is similar to the second IC manufacturing recipe, generating instructions to add one of the first IC manufacturing recipe or the second IC manufacturing recipe to an IC manufacturing recipe library.

12. The method of claim 10, further comprising:
based on the concluding that the first IC manufacturing recipe is similar to the second IC manufacturing recipe, generating a defense report for one of the first IC manufacturing recipe or the second IC manufacturing recipe based on an existing defense record for the other of the first IC manufacturing recipe or the second IC manufacturing recipe.

13. The method of claim 10, further comprising:
based on the concluding that the first IC manufacturing recipe is similar to the second IC manufacturing recipe, executing one of the first IC manufacturing recipe or the second IC manufacturing recipe on the IC manufacturing tool.

14. An integrated circuit (IC) manufacturing recipe similarity evaluation system comprising:
a processor; and
a non-transitory, computer readable storage medium including computer program code for one or more programs, the non-transitory, computer readable storage medium and the computer program code being configured to, with the processor, cause the system to:
retrieve a first set of tool-log entries and a second set of tool-log entries from a tool-log storage device, the first set of tool-log entries having been generated by executing a first IC manufacturing recipe on an IC manufacturing tool which includes forming one or more IC structures, the second set of tool-log entries having been generated by executing a second IC manufacturing recipe on the IC manufacturing tool which includes forming one or more IC structures;
receive a tool-log variable identifying a first entry of the first set of tool-log entries and a first entry of the second set of tool-log entries;
assign a tool-log variable similarity value for the first tool-log entry of the first set of tool-log entries and the first tool-log entry of the second set of tool-log entries based on comparing the first tool-log entry from the first set of tool-log entries to the first tool-log entry from the second set of tool-log entries;
based on the tool-log variable similarity value, calculate a recipe similarity value for the first IC manufacturing recipe and the second IC manufacturing recipe; and
based on the calculated recipe similarity value meeting a predetermined condition, executing the first IC manufacturing recipe or the second IC manufacturing recipe on the IC manufacturing tool as part of forming an IC structure.

15. The IC manufacturing recipe similarity evaluation system of claim 14, wherein the non-transitory, computer readable storage medium and the computer program code are configured to, with the processor, further cause the system to:
calculate the recipe similarity value by comparing the tool-log variable similarity value to a predetermined threshold value.

16. The IC manufacturing recipe similarity evaluation system of claim 14, wherein the non-transitory, computer readable storage medium and the computer program code are configured to, with the processor, further cause the system to:
output an indication of recipe similarity based on the calculated recipe similarity value.

17. The IC manufacturing recipe similarity evaluation system of claim 14, wherein the non-transitory, computer readable storage medium and the computer program code are configured to, with the processor, further cause the system to:
based on the recipe similarity value meeting a predetermined similarity standard, generate a defense report for one of the first IC manufacturing recipe or the second IC manufacturing recipe based on an existing defense record for the other of the first IC manufacturing recipe or the second IC manufacturing recipe.

* * * * *